US011359280B2

(12) United States Patent
Topping et al.

(10) Patent No.: US 11,359,280 B2
(45) Date of Patent: Jun. 14, 2022

(54) APPARATUS AND METHOD FOR PROCESSING, COATING OR CURING A SUBSTRATE

(71) Applicant: CAMVAC LIMITED, Norfolk (GB)

(72) Inventors: Alexander John Topping, Oxfordshire (GB); James Tiw Shipman, Norfolk (GB); Robert William Jarman, Norfolk (GB)

(73) Assignee: CAMVAC LIMITED, Norfolk (GB)

( * ) Notice: Subject to any disclaimer, the term of this patent is extended or adjusted under 35 U.S.C. 154(b) by 8 days.

(21) Appl. No.: 16/651,669

(22) PCT Filed: Sep. 27, 2018

(86) PCT No.: PCT/GB2018/052748
§ 371 (c)(1),
(2) Date: Mar. 27, 2020

(87) PCT Pub. No.: WO2019/064001
PCT Pub. Date: Apr. 4, 2019

(65) Prior Publication Data
US 2020/0263298 A1      Aug. 20, 2020

(30) Foreign Application Priority Data
Sep. 29, 2017    (GB) ..................... 1715779

(51) Int. Cl.
*H01J 37/34*        (2006.01)
*C23C 16/455*       (2006.01)
(Continued)

(52) U.S. Cl.
CPC ........ *C23C 16/45536* (2013.01); *B05D 3/147* (2013.01); *C23C 14/351* (2013.01);
(Continued)

(58) Field of Classification Search
None
See application file for complete search history.

(56) References Cited

U.S. PATENT DOCUMENTS 4,826,584 A    5/1989   Dos Santos Pereiro Ribeiro
5,618,388 A *  4/1997   Seeser .................. C23C 8/02
                                                    118/719
(Continued)

FOREIGN PATENT DOCUMENTS

EP     0242826      10/1987
EP     0242826 A2   10/1987
(Continued)

OTHER PUBLICATIONS

European Patent Office, International Search Report, International Application No. PCT/GB2018/052748, dated Mar. 4, 2019, pp. 1-4.
(Continued)

*Primary Examiner* — Jason Berman
(74) *Attorney, Agent, or Firm* — Hunton Andrews Kurth LLP

(57) ABSTRACT

An apparatus for processing or curing a substrate, the apparatus comprising: a support (102) arranged to transport a moving flexible substrate (104), a plasma generator (110) arranged to generate plasma (112), a magnet array (114) arranged to spatially define the plasma, wherein the magnet array comprises: a first elongate magnet (404) having a first polarity; a second elongate magnet (406), substantially parallel to the first elongate magnet, having a second polarity, opposite to the first polarity, such that the first and second elongate magnets define a first straight magnetic flux portion (204); a third elongate magnet (408), substantially parallel to the first elongate magnet, having the first polarity, such that the second and third elongate magnets define a second straight magnetic flux portion, connected to the first straight magnetic flux portion by a first curved magnetic flux (Continued)

portion (206); a fourth elongate magnet (410), substantially parallel to the first elongate magnet, having the second polarity, such that the third and fourth elongate magnets define a third straight magnetic flux portion, connected to the second straight magnetic flux portion by a second curved magnetic flux portion.

14 Claims, 11 Drawing Sheets

(51) Int. Cl.
*B05D 3/14* (2006.01)
*C23C 14/35* (2006.01)

(52) U.S. Cl.
CPC ...... *H01J 37/3405* (2013.01); *H01J 37/3408* (2013.01); *H01J 37/3452* (2013.01)

(56) References Cited

U.S. PATENT DOCUMENTS

| | | | |
|---|---|---|---|
| 2007/0012559 A1* | 1/2007 | Hosokawa | H01J 37/3408 204/192.1 |
| 2008/0067062 A1* | 3/2008 | Deppisch | H01J 37/3408 204/298.01 |
| 2008/0202919 A1* | 8/2008 | Han | H05K 1/09 204/192.12 |
| 2009/0159429 A1* | 6/2009 | Tsukamoto | H01J 37/3277 204/192.12 |
| 2010/0193354 A1 | 8/2010 | Chu | |

FOREIGN PATENT DOCUMENTS

| | | |
|---|---|---|
| EP | 2653586 A1 | 10/2013 |
| GB | 2534430 B | 9/2017 |
| KR | 1020150033858 A | 4/2015 |
| KR | 20170012489 | 2/2017 |
| KR | 20170012489 A | 2/2017 |
| WO | 2005098898 | 10/2005 |
| WO | 2005098898 A1 | 10/2005 |

OTHER PUBLICATIONS

International Searching Authority, PCT Notification of Transmittal of the International Search Report and the Written Opinion, International Application No. PCT/GB2018/052748, dated Mar. 4, 2019, pp. 1-17.
U.K. Intellectual Property Office, Combined Search and Examination Report Under Sections 17 & 18(3), Application No. GB1715779.3, dated Mar. 1, 2018, pp. 1-3.
U.K. Intellectual Property Office, Search Report Under Section 17, Application No. GB1715779.3, dated Feb. 28, 2018, p. 1.
U.K. Intellectual Property Office, Examination Report Under Section 18(3), Application No. GB1715779.3, dated Jun. 28, 2018, p. 1.
U.K. Intellectual Property Office, Examination Report Under Section 18(3), Application No. GB1715779.3, dated Jul. 4, 2019, p. 1.
U.K. Intellectual Property Office, Combined Search and Examination Report Under Sections 17 & 18(3), Application No. GB1808704.9, dated Jun. 28, 2018, pp. 1-2.
U.K. Intellectual Property Office, Search Report Under Section 17, Application No. GB1808704.9, dated Jun. 27, 2018, p. 1.
U.K. Intellectual Property Office, Examination Report Under Section 18(3), Application No. GB1808704.9, dated Feb. 6, 2019, p. 1.
European Patent Office, Communication Pursuant to Article 94(3) EPC, European Patent Application No. 18782146.7, dated Nov. 9, 2021, pp. 1-7.
Intellectual Property Office of India, Indian Patent Application No. 202017012892, Examination Report Under Sections 12 & 13 of the Patents Act, 1970 and the Patent Rules, 2003, Mar. 23, 2022, pp. 1-7.

* cited by examiner

APPARATUS AND METHOD FOR PROCESSING, COATING OR CURING A SUBSTRATE

This application is a U.S. national phase application under 35 U.S.C. § 371 of International Application No. PCT/GB2018/052748, filed Sep. 27, 2018, which claims priority to U.K. Application No. 1715779.3 filed Sep. 29, 2017, the complete disclosure of which is incorporated herein by reference.

BACKGROUND

Ceramic based clear barrier coatings are useful for a number of applications including packaging of oxygen or moisture sensitive foodstuffs, encapsulation of gas or moisture sensitive components in electronics, and a variety of other functional applications requiring barrier properties. These coatings can be applied to flexible substrates using roll to roll processing.

A number of methods for producing barrier coatings are known, for example, High Speed Physical Vapour Deposition (PVD). This method is relatively high speed and low cost, but can produce relatively poor barriers. Improved barrier properties can be achieved through a number of known techniques including reactive sputtering, Chemical Vapour Deposition and Atomic Layer Deposition. However all of these techniques are lower speed and therefore higher cost, particularly when used in roll to roll processing.

Plasma Enhanced Chemical Vapour Deposition (PECVD) is also a known technique for producing barrier coatings. However in PECVD the deposition rate is limited as the coating will only be deposited in a generated plasma zone. Increasing the amount of precursor materials applied has an effect of quenching the plasma which stops the deposition of the coating. Therefore, although high quality barrier coatings can be produced with this technique, it is a lower speed technique which results in low line speed when the technique is used in roll to roll processing.

Magnetron plasma reaction devices with multiple individual racetracks (magnetically confined regions of higher plasma density), powered from a single power source have been used to increase line speed. However, there are a number of disadvantages associated with such an arrangement. Specifically, it can be very difficult to ensure that the racetracks are stable and equally energised. Any differences and variance in the gas pressures in the vicinity of racetracks can result in uneven powering of individual racetracks causing local variation in applied power with effects on the uniformity of material produced and the ultimate long term viability of any such process. Such an arrangement therefore requires very high engineering tolerances and tight control and consistency of the magnets and process pressures when multiple individual racetracks are generated from a single power source.

SUMMARY

According to a first aspect of the invention there is provided an apparatus according to claim 1.

Thus the apparatus according to the first aspect provides a single magnetron with multiple straight racetrack zones which are joined together in an alternating fashion to together form a continuous snaking or serpentine shape, where the substrate can be processed, coated or cured which increases the amount of substrate that can be treated in a given time, thus speeding up the processing, coating or curing time overall. The serpentine racetrack can for example comprise at least four generally parallel, straight regions and at least four end or turning regions which combine to define one continuous closed loop racetrack with a single path.

Advantages of the first aspect are that it only requires a single power source, and the engineering tolerances required are reduced compared to multiple racetrack systems because small variance in magnet strength, electric field strength and process pressure around the drum have a reduced effect on the racetrack powering level. Thus all areas of the racetrack are energised to substantially the same level, particularly the straight portions of the racetrack. This means that the spatial processing, coating or curing applied to the substrate is more consistent.

Substantially parallel can mean an angle of $\geq 0°$ but $<45°$, $\geq 0°$ but $<25°$ or $\geq 0°$ but $<10°$ between the elongate magnets.

The magnet array can comprise:
a first elongate magnet having a first polarity;
a second elongate magnet, positioned adjacent and substantially parallel to the first elongate magnet, having a second polarity opposite to the first polarity, such that the first and second elongate magnets define a first straight magnetic flux portion between them;
a third elongate magnet having a first end and a second end, the third magnet being positioned adjacent and substantially parallel to the second elongate magnet, having the first polarity, such that the second and third elongate magnets define a second straight magnetic flux portion between them, the second straight magnetic flux portion being connected to the first straight magnetic flux portion by a first curved magnetic flux portion which extends around the first end of the second elongate magnet; and
a fourth elongate magnet positioned adjacent and substantially parallel to the third elongate magnet, the fourth elongate magnet having a first end and a second end, the first end being adjacent to the second end of the third elongate magnet, the fourth elongate magnet having the second polarity, such that the third and fourth elongate magnets define a third straight magnetic flux portion between them, the third straight magnetic flux portion being connected to the second straight magnetic flux portion by a second curved magnetic flux portion which extends around the first end of the third elongate magnet.

One or each elongate magnet can be formed from a plurality of individual sub-magnets, all having the same orientation and polarity.

The array of elongate magnets can have a first end region, this being the end region which is closest to a first end of each of the elongate magnets, and a second end region, this being the end region which is closest to an opposite, second end of each of the elongate magnets.

The longitudinal centre of the first elongate magnet can be aligned with the longitudinal centre of the third elongate magnet. The longitudinal centre of the second elongate magnet can be aligned with the longitudinal centre of the fourth elongate magnet. The longitudinal centres of the first and third elongate magnets can be offset with respect to the longitudinal centres of the second and fourth elongate magnets.

Having an offset arrangement of the elongate magnets enables the elongate magnets to contribute to defining a serpentine or snaking racetrack.

The magnet array can further comprise one or more turning magnets. Each turning magnet can be arranged to encourage the racetrack to bend around an end region of an elongate magnet, which will be referred to as a 'target elongate magnet'. One or each turning magnet can have an opposite polarity with respect to its target elongate magnet and the same polarity as the pair of adjacent elongate magnets between which the target magnet is situated, these adjacent magnets being referred to as 'common elongate magnets'.

Thus the turning magnets can be used to more accurately direct the path of the racetrack to form curved sections which join the straight racetrack sections together into a serpentine shape.

Each turning magnet can be located at one end of a common elongate magnet, wherein the turning magnets each have a different orientation from the orientation of the elongate magnets. Some or all of the turning magnets can be elongate and orientated so as to be substantially perpendicular to the elongate magnets.

First and third turning magnets can be located at a first end of the first and third elongate magnets respectively and second and fourth turning magnets can be located at a second end of the second and fourth elongate magnets, wherein the second end is opposite to the first end, and wherein the turning magnets have an orientation that is substantially perpendicular (i.e. oriented at an angle >45°) to the longitudinal axis of the elongate magnets.

This arrangement of the magnet array can affect the turning of the racetrack at the curved sections more effectively and limits energy bleed in these areas.

The centre of each turning magnet can be aligned with the longitudinal axis of each corresponding elongate magnet.

Such an arrangement can provide an optimum racetrack turn, which can reduce energy bleed.

One end of each of the turning magnets can be aligned with the longitudinal axis of each corresponding elongate magnet.

The first turning magnet can be in contact with the third turning magnet and the second turning magnet can be in contact with the fourth turning magnet. This can result in a closed magnetic field.

The elongate magnets and turning magnets of the magnet array can be arranged into a staggered or zigzag formation. This can result in a closed magnetic field.

A turning magnet may be located at one end of each of the elongate magnets, wherein the turning magnets are oriented at 45° to the elongate magnets and are located at alternate ends of each of the elongate magnets. This can result in a closed magnetic field.

The magnet array can comprise additional guiding magnets spaced from the ends of the elongate magnets. This can result in a closed magnetic field.

The guiding magnets can be oriented at substantially 90° to the turning magnets.

The substrate can be flexible and the apparatus can further comprise a support such as a rotatable drum that is arranged to move in order to transport the flexible substrate.

Alternatively, the apparatus can comprise a planar magnetron sputtering reaction plate arranged adjacent and parallel with respect to the race track. Thus, in some embodiments the serpentine racetracks have application for magnetron sputtering. A conventional racetrack for magnetron sputtering is a simple loop or oval. This has limitations as it limits the maximum depth of target or reaction plate from which material can be deposited in order to achieve maximum target utilisation. This combined with the need to cool the reaction plate and magnets means that deposition rate onto the substrate is limited and simply increasing the power is not always an advantage as this can cause overheating and even melting of the reaction plate in extreme cases. Practically it is power density (Kw/m2 of reaction plate) rather than total power that needs to be considered. Very high power densities can be problematic due to cooling problems. This combined with a largely finite area for a magnetron of given width means ultimate deposition rate is limited. The present inventors have identified that these issues can be addressed with serpentine racetracks. In view of the fact that the length of a serpentine racetrack can be much longer than a conventional racetrack, much deeper and therefore larger magnetron targets for a given width can therefore be utilised as the serpentine racetrack can be designed such that it snakes around the target enabling high target utilisation of even very large targets. Thus, higher deposition powers can be utilised as although overall power is higher, the power density at any given part of the racetrack can be less or comparable to a conventional racetrack. Therefore by using the serpentine racetrack the overall power and thus deposition rate can be increased but power density can be kept to a level that enables sufficient cooling to be achieved subject to correct geometrical considerations (i.e. so that the substrate interacts with the part of the magnetron from which deposition is being achieved). For substrate coating a similar approach can also be used on cylindrical magnetrons so that more of the surface can be utilised for coating at any time.

According to a second aspect of the invention there is provided an apparatus according to claim 14.

According to a third aspect of the invention there is provided a method according to claim 15.

Thus the invention of the second and third aspects enables barrier layers to be manufactured in a roll to roll process by building up the barrier in multiple repeating steps, thereby increasing line speed as the barrier layer can be applied to multiple locations simultaneously.

Another advantage of the second and third aspects is that plasma quench is reduced compared with a standard PECVD process as the majority of the reaction occurs on the surface of the substrate rather than within the plasma and because each curing station introduces only a small amount of precursor to the substrate at a time.

The second and third aspects of the invention may be used advantageously in combination with the first aspect of the invention as the serpentine racetrack can be used to provide a continuous racetrack around the drum, which provides more sites available for location the curing stations of the second and third aspects. In addition, using one serpentine racetrack around the drum ensures that the plasma is more evenly energised so that each curing station cures or processes the substrate to the same or similar degree as each other curing station which makes the process more controllable and accurate.

BRIEF DESCRIPTION OF THE DRAWINGS

Embodiments of the invention will now be described with reference to the accompanying drawings, in which.

DESCRIPTION

Figure 1:
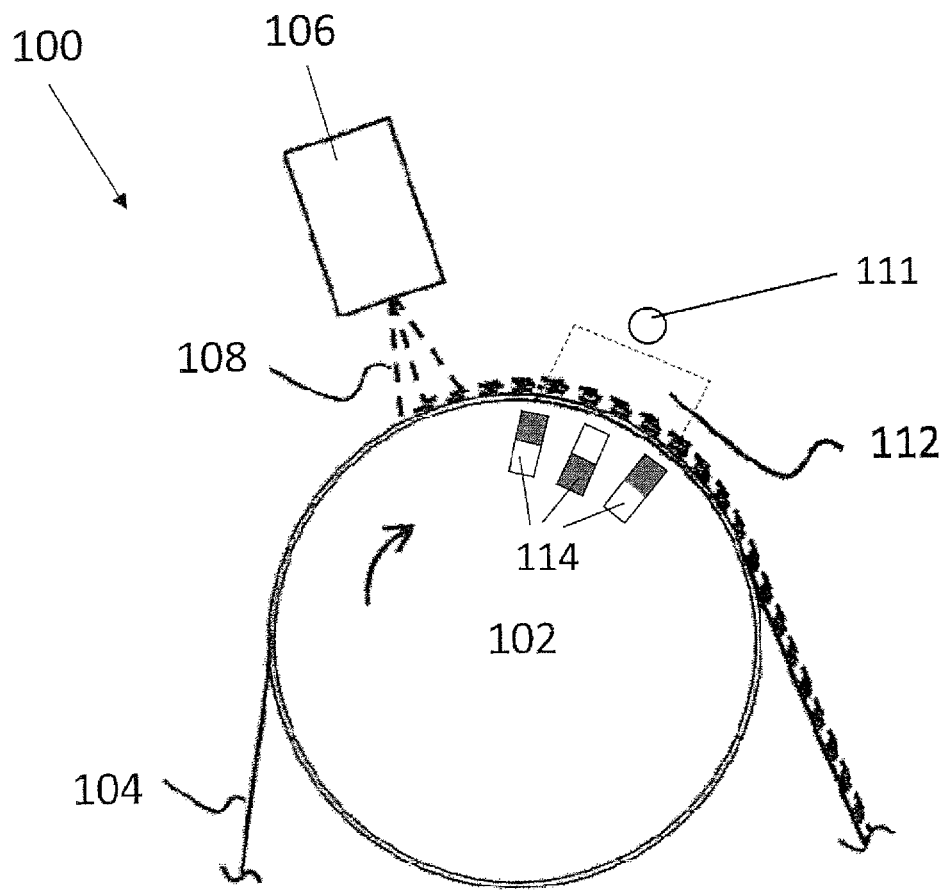
FIG. 1 is a schematic diagram of an apparatus for curing, coating or processing a substrate.

FIG. 1 shows an apparatus 100 for processing, coating or curing a substrate. The apparatus 100 comprises a rotating drum 102 for transporting a moving web substrate 104 over the surface of the drum 102. Located adjacent to the drum 102 there is provided a precursor inlet 106 arranged to apply a precursor 108 to the substrate 104 as it passes underneath the precursor inlet 106. Inside the drum 102 there is a magnet array 114. By charging the drum with a suitable power supply (not shown) with respect to an opposite electrode 111 a plasma region 112 can be generated. The magnet array 114 is fixed such that as the drum 102 turns, the magnet array 114 does not turn with the drum 102 but allows the circumferential surface of the drum 102 and transported film substrate 104 to pass over it. The opposite electrode 111 may be any shape and may carry either the opposite charge with respect to the drum or be earthed. In addition, the electrode 111 may be part of the vacuum chamber or apparatus itself and/or be used to deliver a gas with which to generate the plasma. The power supply used may be AC or pulsed DC. The magnet array 114 contains the resultant plasma generated. The whole apparatus is located inside a vacuum chamber (not shown). In the embodiment shown in FIG. 1, the web substrate is a polymeric film, for example PET. However, any suitable web based substrate could be used.

Figure 2:
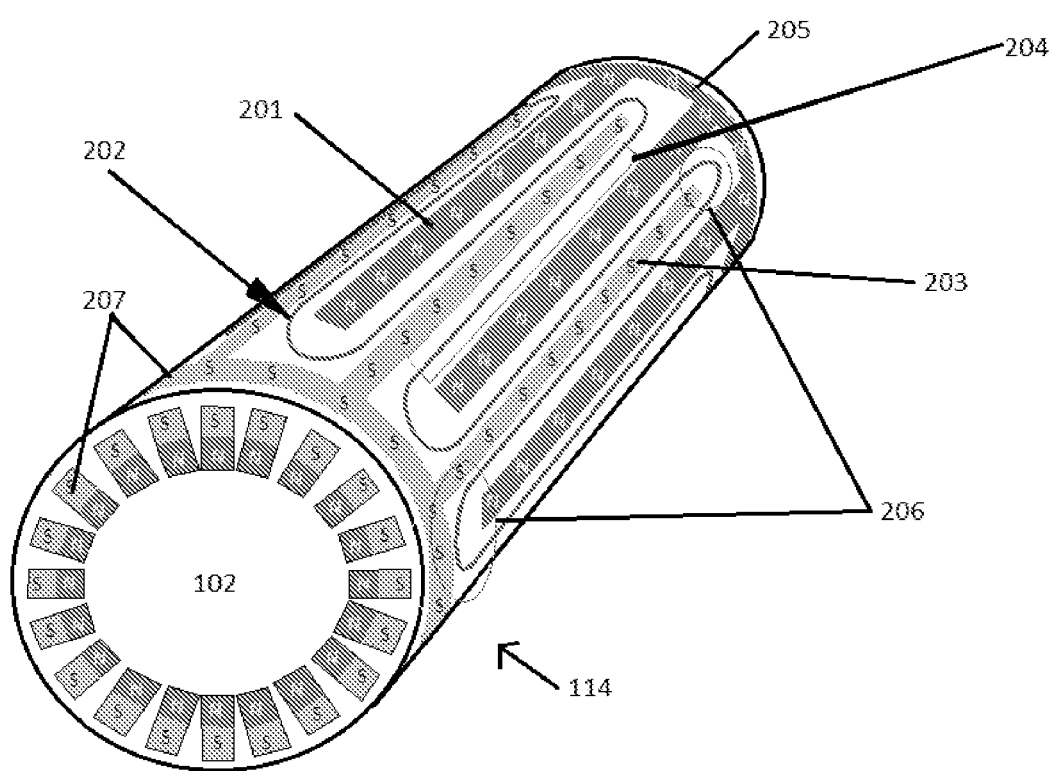
FIG. 2 is a schematic diagram of a drum having a serpentine racetrack according to an embodiment of the invention.

FIG. 2 shows a drum 102 with a serpentine racetrack 202. The racetrack 202 comprises a number of straight magnetic flux portions 204 linked together at alternate ends by curved end portions 206 to form a serpentine race track 202.

The magnet array 114 comprises alternating first and second polarity elongate magnets 201 and 203 which extend across the drum 102 and optionally two rings of magnets 205 and 207, one at each end of the drum 102. The first elongate magnets 201 are orientated such that the N pole faces out towards the outer curved surface of the drum 102 and the S pole towards the central rotational axis of the drum 102. The second elongate magnets 203 are orientated such that the S pole faces out towards the curved surface of the drum 102 and the N pole towards the central rotational axis of the drum 102. The elongate magnets 201 and 203 alternate around the drum such that the orientation of the magnetic field alternates around the drum 102. The elongate magnets 201 and 203 are also arranged in a staggered manner with the first elongate magnets 201 being offset from the centre of the drum 102 towards one end and the second elongate magnets 203 being offset from the centre towards the other end of the drum 102. This configuration of the magnet array 114 generates the snaking racetrack 202 having straight magnetic flux portions 204 linked together at alternate ends by curved end portions 206.

In some embodiments, oppositely orientated rings of magnets 205 and 207 can be added at the ends of the drum 102 in order to improve the turning characteristics of the racetrack 202 in the curved end portions 206. In the illustrated embodiment, at the end of the drum 102 towards which the first elongate magnets 201 are offset, there is a first ring of magnets 205. All the magnets in the first ring 205 are orientated such that the N pole points towards the outer curved surface of the drum 102 and the S pole points towards the centre rotary axis of the drum 102 i.e. the first ring of magnets in 205 are arranged the same way as the first elongate magnets 201. At the end of the drum 102 towards which the second elongate magnets 203 are offset, there is a second ring of magnets 207.

All the magnets in the second ring 207 are orientated such that the S pole points towards the outer curved surface of the drum 102 and the N pole points towards the centre rotary axis of the drum 102 i.e. the second ring of magnets 207 are arranged the same way as the second elongate magnets 203.

FIGS. 3 to 8 show a number of different embodiments that can each produce a serpentine racetrack.

Figure 3:
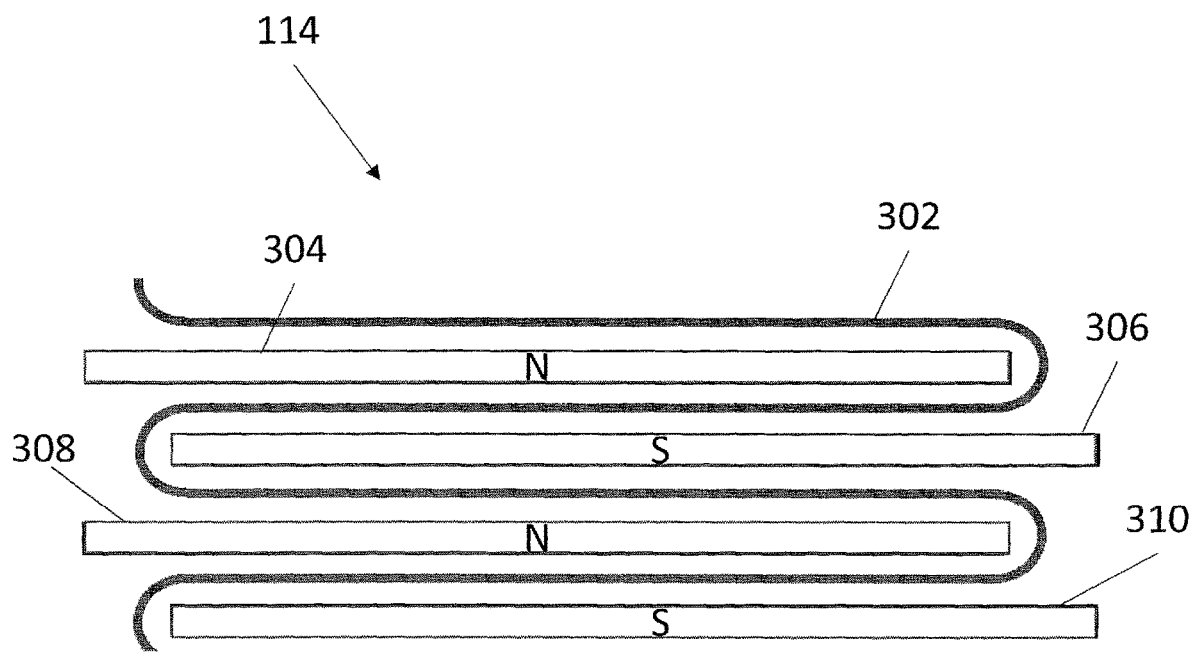
FIG. 3 is a schematic diagram of a magnet array for producing a racetrack as shown in FIG. 2.

FIG. 3 shows the magnet array 114 of FIG. 2 without the optional rings of magnets. The magnet array comprises a first elongate magnet 304 having a polarity such that the north pole of the magnet 304 faces in a direction pointing radially out of the drum 102 and the south pole of the magnet 304 faces in a direction pointing towards the rotational axis of the drum 102.

A second elongate magnet 306 is located adjacent to the first elongate magnet 304. The second elongate magnet 306 is spaced from the first elongate magnet 304 and the longitudinal axis of the second elongate magnet 306 is aligned parallel or generally parallel to the longitudinal axis of the first elongate magnet 304. The second elongate magnet 306 has an opposite polarity to the first elongate magnet 304 such that the south pole of the second elongate magnet 306 faces in a direction pointing radially out of the drum 102 and the north pole of the magnet 306 faces in a direction pointing towards the rotational axis of the drum 102.

A third elongate magnet 308 is located adjacent to the second elongate magnet 306. The third elongate magnet is spaced from the second elongate magnet 304 and the longitudinal axis of the third elongate magnet 308 is aligned parallel to the longitudinal axis of the first elongate magnet 304 and the second elongate magnet 306. The third elongate magnet has the same polarity as the first elongate magnet 304.

A fourth elongate magnet 310 is located adjacent to the third elongate magnet 308. The fourth elongate magnet is spaced from the third elongate magnet 304 and the longitudinal axis of the fourth elongate magnet 310 is aligned parallel to the longitudinal axis of the other elongate magnets 304, 306 and 308. The fourth elongate magnet has the same polarity as the second elongate magnet 304.

The transverse centres of the first and third elongate magnets (304 and 308 respectively) are aligned with each other. The transverse centres of the second and fourth elongate magnets (306 and 310 respectively) are also aligned with each other, but the transverse centres of the second and fourth magnets 306, 310 are offset with respect to the transverse centres of the first and third elongate magnets 304, 308. Thus, the magnet array 114 is arranged such that each elongate magnet defines a passage region, where its first end terminates prematurely in comparison to flanking ends of adjacent elongate magnets to encourage flux flow around the first end, and a blocking region, where its second end projects beyond terminating magnet ends of the adjacent magnets to inhibit flux flow around the second end of the magnet.

FIGS. 4 to 8 show embodiments having the first and second rings of magnets 205, 207 which result in a serpentine racetrack 202 that is more confined in the end turning regions, in comparison to those of the embodiment shown in FIG. 3. As such, the embodiments of FIGS. 4 to 8 can have improved race track definition and therefore reduced "energy bleed" in these regions in comparison to the embodiment shown in FIG. 3.

Figure 4:
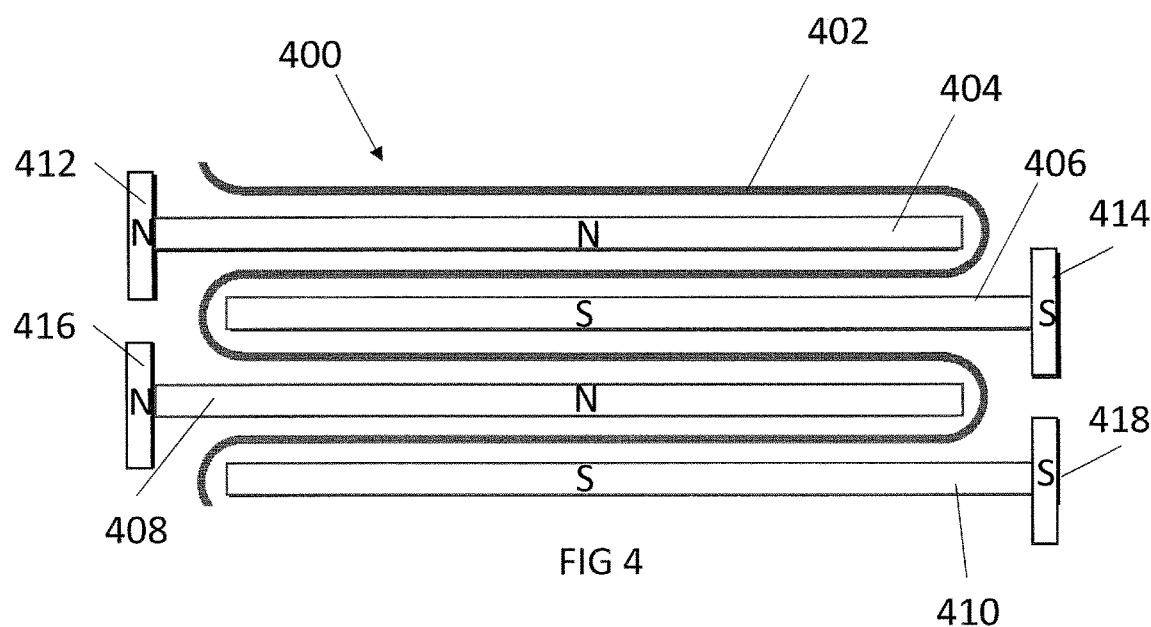
FIG. 4 is a schematic diagram of an alternative magnet array for producing a racetrack as shown in FIG. 2.

FIG. 4 shows magnet array 400 which is an alternative embodiment of magnet array 114, and which generates a serpentine plasma racetrack 402. Magnet array 400 includes four elongate magnets 404, 406, 408, 410 arranged in the same manner as described above in relation to the elongate magnets of FIG. 3.

In addition, magnet array 400 also includes a first turning magnet 412, having a first polarity (which is the same as the polarity of the first elongate magnet 404) located at a first end of the first elongate magnet 404, on a first side of the magnet array. The transverse centre of the first turning magnet 412 is aligned with the longitudinal centre of the first elongate magnet 404, in a T shaped arrangement.

Magnet array 400 also includes a second turning magnet 414, having a second polarity (which is the same as the polarity of the second elongate magnet 406) located at a second end of the second elongate magnet 406, wherein the second end is located at an opposite side of the magnet array from the first side. The transverse centre of the second turning magnet 414 is aligned with the longitudinal centre of second elongate magnet 406, for a T shaped arrangement.

A third turning magnet 416, has the first polarity and is arranged at the first end of the third elongate magnet 408, also in a T shaped arrangement, similar to the first turning magnet 412.

A fourth turning magnet 418, has the second polarity and is arranged at the second end of the fourth elongate magnet 410, also in a T shaped arrangement, similar to the second turning magnet 414.

The turning magnets of the first polarity are located on the first side of the magnet array and the turning magnets of the second polarity are located on the second side of the magnet array. Thus the turning magnets 412, 414, 416 and 418 are located at alternating ends of the elongate magnets 404, 406, 408, 410. The second ends of the first and third elongate magnets and the first ends of the second and fourth elongate magnets are open ends in the sense that they do not have an adjacent turning magnet. In the embodiment shown in FIG. 4, there are gaps between the first turning magnet 412 and the third turning magnet 416 and between the second turning magnet 414 and the fourth turning magnet 418.

Figure 5:
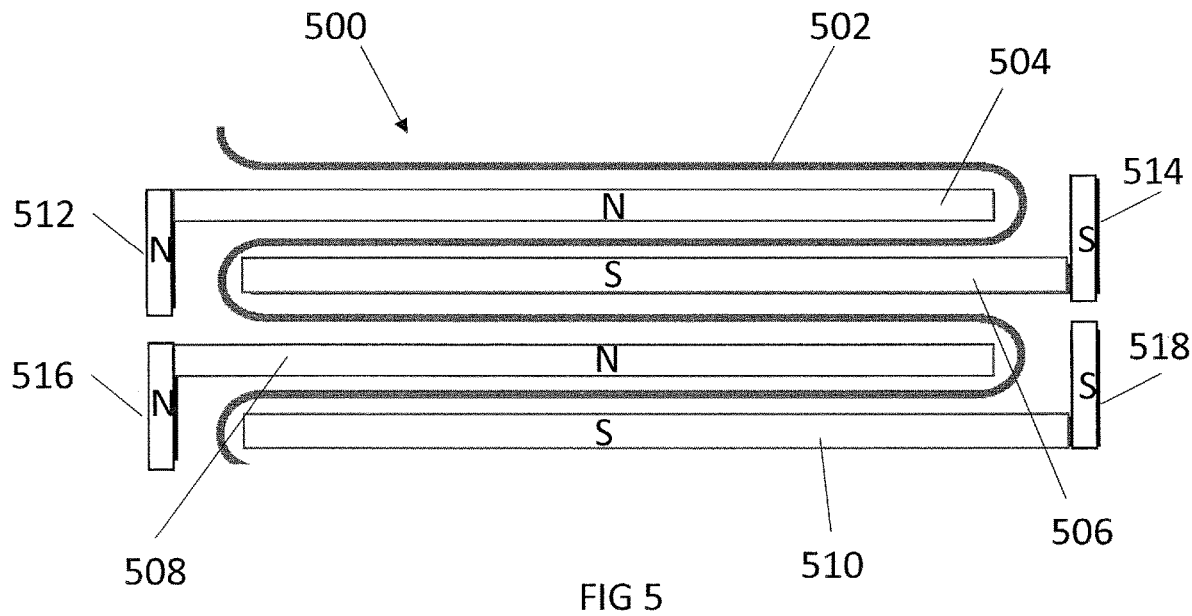
FIG. 5 is a schematic diagram of an alternative magnet array for producing a racetrack as shown in FIG. 2.

FIG. 5 shows an alternative magnet array 500 for forming a serpentine shaped plasma racetrack 502. The four elongate magnets 504, 506, 508, 510 shown in FIG. 5 are arranged similarly to those shown in FIGS. 3 and 4. However the turning magnets 512, 514, 516 and 518 are aligned to the elongate magnets 504, 506, 508, 510 in an L shaped configuration, i.e. the end of the first turning magnet 512 is aligned with the first end of the elongate magnet 512. The turning magnets having a first polarity are located on a first side of the magnet array and the turning magnets having an opposite polarity to the first polarity are located at the opposite side of the magnet array, such that the turning magnets 512, 514, 516, 518 are located at alternating ends of the elongate magnets 504, 506, 508, 510.

Figure 6:
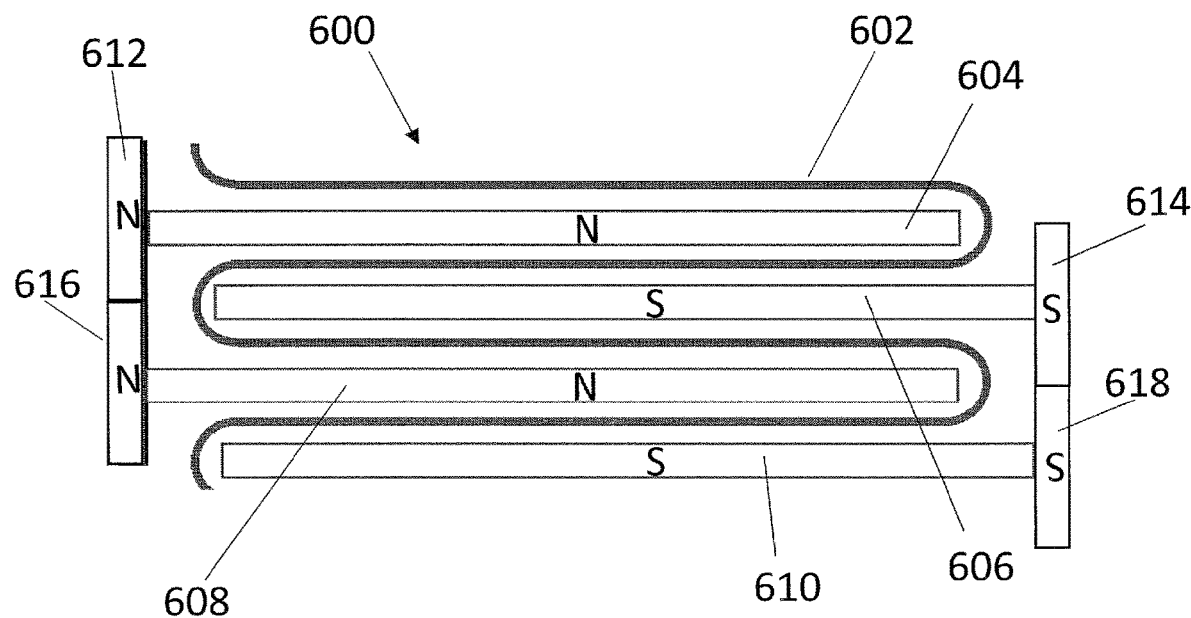
FIG. 6 is a schematic diagram of an alternative magnet array for producing a racetrack as shown in FIG. 2.

FIG. 6 shows an alternative magnet array 600 for forming a serpentine shaped plasma racetrack 602. The four elongate magnets 604, 606, 608, 610 shown in FIG. 6 are arranged similarly to the elongate magnets shown in FIGS. 3 to 5. The turning magnets 612, 614, 616 and 618 are arranged in the T shaped arrangement described in relation to FIG. 4. However in the arrangement shown in FIG. 6, each turning magnet is arranged to contact the next turning magnet on the same side of the magnet array. So, the first turning magnet 612 contacts the third turning magnet 616 and the second turning magnet 614 contacts the fourth turning magnet 618.

Figure 7:
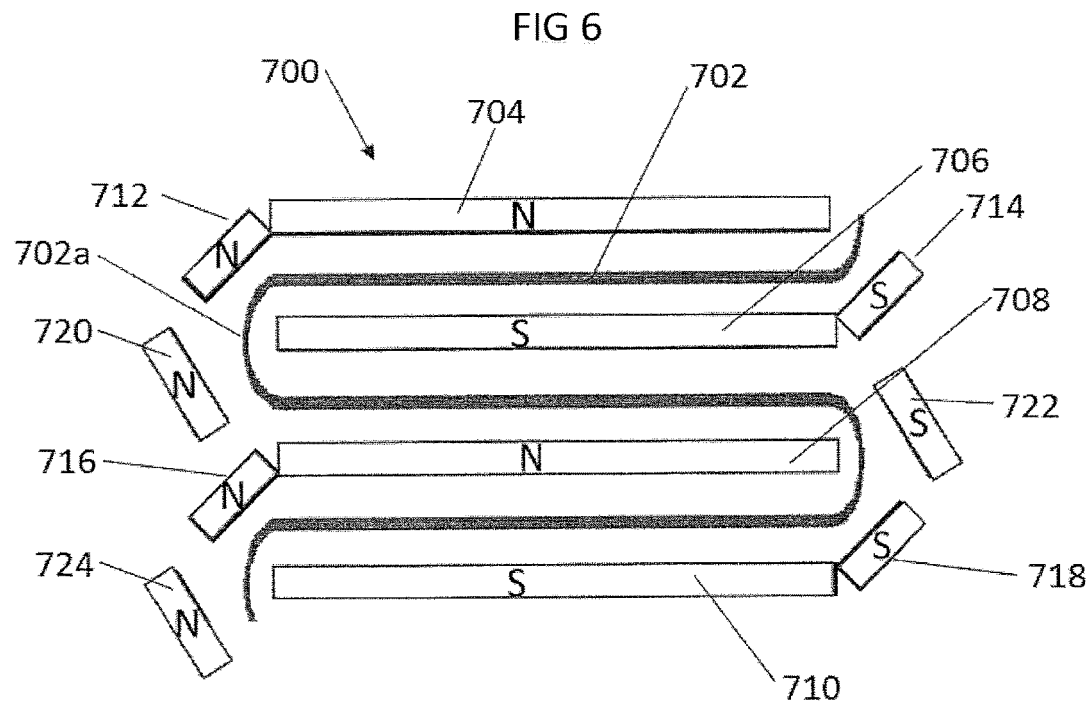
FIG. 7 is a schematic diagram of an alternative magnet array for producing a racetrack as shown in FIG. 2.

FIG. 7 shows an alternative magnet array 700 for forming a serpentine shaped plasma racetrack 702. This Magnet array 700 comprises first and third elongate magnets (704, 708 respectively) having a first polarity and second and third elongate magnets 706, 710 having a second polarity. The transverse centres of each of the four elongate magnets are aligned with each other. The first turning magnet 712 has the first polarity and is located at a first end of the first elongate magnet 704 and is orientated at an angle of 25-75° to the first elongate magnet 704; for example, 45°. The first turning magnet 712 is angled towards the second elongate magnet 706 such that it defines a curved portion of the plasma racetrack 702a. Second turning magnet 714 has the second polarity and is located at a second end of the second elongate magnet 706 and is orientated at an angle of 25-75° to the second elongate magnet 706; for example, 45°. The second turning magnet 714 is angled towards the third elongate magnet 708 such that it defines a curved portion of the plasma racetrack 702a.

The third turning magnet 716 is located adjacent to the third elongate magnet 708 and has the same orientation and polarity as the first turning magnet 712. The fourth turning magnet 718 is located adjacent to the fourth elongate magnet 710 and has the same orientation and polarity as the second turning magnet 714.

Additional guiding magnets 720, 722, 724 and 726 can optionally be included in the magnet array 700 of FIG. 7 to improve the controllability of the shape of the plasma racetrack. The first guiding magnet 720 is orientated at an angle of 90° with respect to the first turning magnet 712 and is located between the first and third turning magnets 712 and 716, spaced from the first end of the second elongate magnet 706. The second guiding magnet 722 is orientated at an angle of 45-135°, such as 90°, with respect to the second turning magnet 714 and is located between the first and third turning magnets 712 and 716, spaced from the second end of the third elongate magnet 708. The third guiding magnet 724 is orientated at an angle of 45-135°, such as 90°, with respect to the first and third turning magnets 712, 716 and is located spaced from the first end of the fourth elongate magnet 708.

Although the magnet arrays shown in FIGS. 3 to 7 each have four elongate magnets, the skilled person will appreciate that an apparatus according to the claimed invention could comprise a magnet array having more than four elongate magnets, as more elongate magnets, turning magnets and guiding magnets could be added to each magnet array shown to extend the array by continuing the repeating pattern, thereby increasing the number of turns in the serpentine plasma racetrack.

In some embodiments, the magnet array forms a closed loop around the drum 102, such that the serpentine shaped plasma racetrack winds around the drum 102. In FIG. 4, the magnets 412 and 416 can form part of the ring of turning magnets 205 shown in FIG. 2 and the magnets 414 and 418 can form part of the ring of turning magnets 207.

In FIG. 5, the magnets 512 and 516 can form part of the ring of turning magnets 205 and magnets 514 and 518 can form part of the ring of turning magnets 207. In FIG. 6, magnets 612 and 616 can form part of the ring of turning magnets 205 and magnets 614 and 618 can form part of the ring of turning magnets 207. In FIG. 7, the magnets 712 and 716 and optionally 720 and 724 can form part of the ring of magnet ring 205 and magnets 714 and 718 and optionally 722 form part of the magnet ring 207.

In the embodiments shown in FIGS. 3 to 7 the elongate magnets, turning magnets and guiding magnets are each formed from a single elongate magnet. However, the skilled person will appreciate that each elongate magnet could alternatively be formed from a number of smaller magnets, of any shape all having aligned polarities to define an elongate magnetic field.

In the embodiments shown in FIGS. 3 to 7, the spacing between each of the elongate magnets is substantially equal. However, unequal spacing between the elongate magnets could also be used.

In the embodiments shown the elongate magnets are parallel to each other. However the skilled person will appreciate that it is not necessary for the elongate magnets to be exactly parallel. A substantially parallel alignment (angles within 45° of parallel) can also be used in embodiments of the invention.

Figure 8:
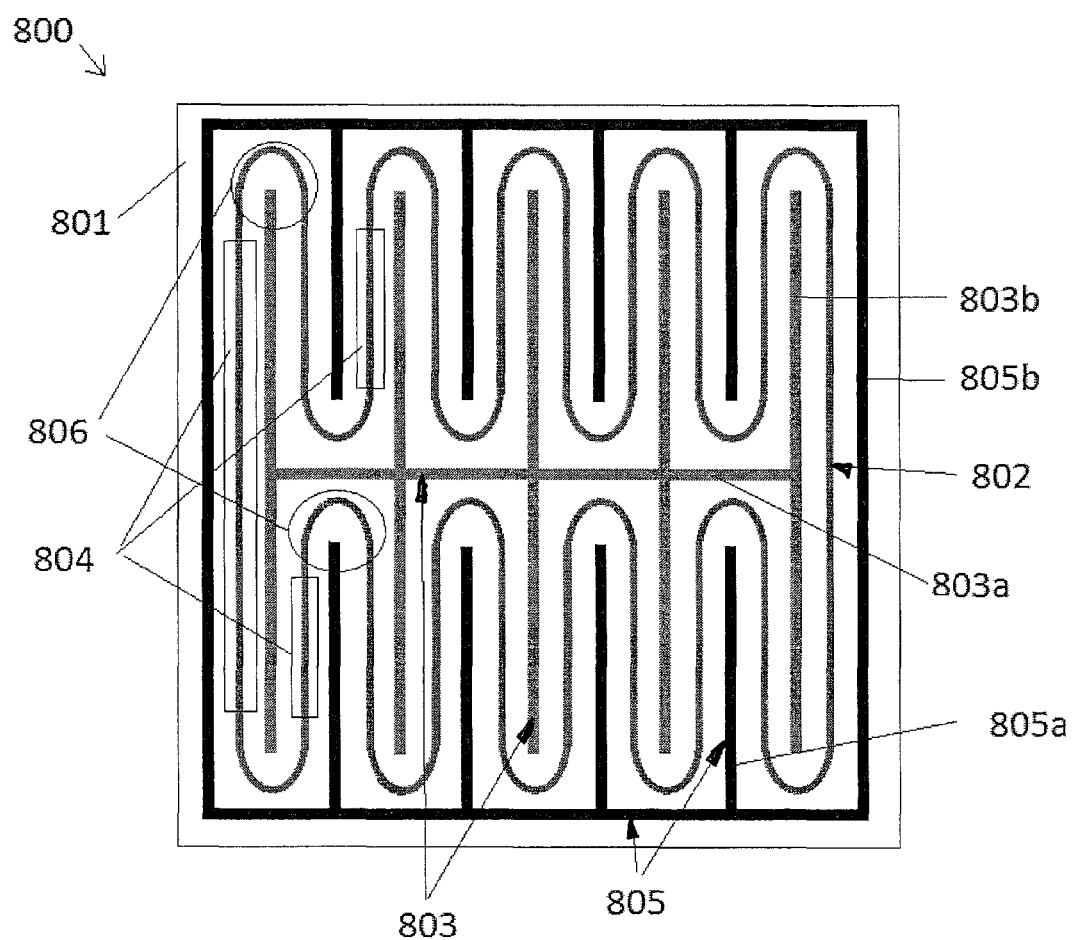
FIG. 8 is a schematic diagram of an alternative embodiment in which a serpentine racetrack is formed on a planar sputtering target.

FIG. 8 shows apparatus 800 according to a further embodiment for defining a serpentine racetrack 802 on a planar magnetron. The serpentine racetrack 802 is formed on the reaction plate 801 of the magnetron by a magnet array. The magnet array comprises an inner array of magnets 803 and an outer array of magnets 805. All the magnets used to make the inner array 803 are in the same orientation with respect to the reaction plate 801 with one pole facing up towards the reaction plate and the other away. Similarly, the magnets of the outer array 805 are all in the same orientation with respect to the reaction plate 801. The orientation of the magnets that form the inner array 803 is opposite to the orientation of the magnets that form the outer array 805.

The inner array 803 comprises at least one central elongate magnet 803a and a plurality of parallel fingers of magnets 803b that protrude from one or both sides of the central magnet 803a at a perpendicular angle. The outer array of magnets 805 comprises a rectangle of magnets 805b with fingers of magnets 805a that protrude inwardly from one or both opposing sides of the rectangle of magnets 805b at a perpendicular angle such that they protrude between the fingers of the inner magnet array 803b. Although the diagram shows for the central magnet array 803, the fingers 803b protruding at right angle to the central line of magnets 803a this need not be the case; an angle between 30° and 150° can be used. Likewise, although the diagram shows for the outer magnet array 805, the fingers 805a protruding at right angle to the central line of magnets 805b, this need not be the case; an angle between 30° and 150° can be used. Additionally, while in the illustrated embodiment the inner and outer finger portions 803b, 805a protrude from both sides, it is possible to generate a serpentine racetrack by only protruding from one side of the central line 803a and one side of the outer rectangle of magnets 805b.

When energised by a suitable power supply (not shown), the magnet array contains the generated plasma within a serpentine racetrack 802. This racetrack 802 consisting of parallel racetrack portions 804 and turning regions 806. The exact number of parallel portions 804 has no limit but must be at least four. Similarly, the exact number of turning end portions 806 has no limit but must be at least four.

Thus, apparatus according to embodiments of the invention can define a serpentine racetrack for processing, curing or coating a substrate. Processing can also describe impinging a target for sputtering.

Figure 9:
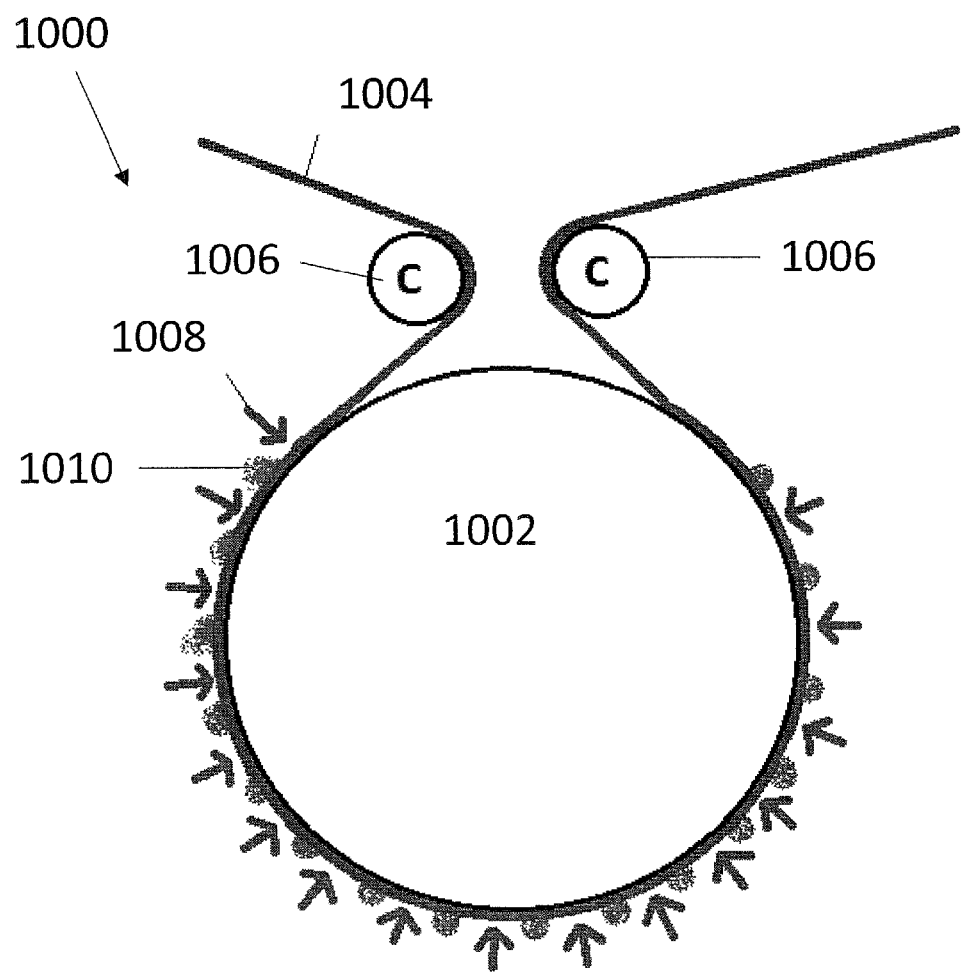
FIG. 9 is a schematic diagram of an apparatus for curing or processing a substrate according to an embodiment of the invention.

FIG. 9 shows an apparatus according to a further embodiment of the invention generally at 1000. The apparatus 1000 is arranged to deposit a silicone based barrier coating onto a substrate. A moving web 1004 is transported around a water cooled drum 1002 that is itself charged either positively or preferably negatively with respect to earth by an AC or pulsed DC power source (not shown). The web 1004 is guided on and off the drum 1002 by guide rollers 1006. These 1006 rollers may be driven or idle. Whilst it is transported around the drum the web 1004 is alternatingly dosed with Silane monomer from one of a plurality of precursor inlet points 1008 then plasma reacted to form the barrier layer (SiOx or SiNx for example) by discrete plasma race track portions 1010. The race track is formed by a permanent magnet array (not shown) that can be either external to the drum or held entirely within the drum, such as the magnet arrays shown in FIGS. 1 to 9, or a combination of the two.

The reactive gas, such as O2, N2O, NH3 etc., that reacts with the Silane precursor can be delivered into the chamber generically in which case the reaction primarily occurs within the plasma race track portions 1010, or where these interact with the surface of the web. Alternatively, the reactive gas can be delivered at the same position as the silane is dosed 1008. In this case the reactive gas can either be controlled and dosed independently or mixed and dosed with the Silane.

The discrete race track portions 1010 can be generated as a number of individual parallel racetracks on the deposition roller. Alternatively, they may be generated by a magnet array designed to produce a single racetrack which snakes around the drum with a number of discrete parallel or largely parallel (<45° off parallel) race track portions where the reaction of the Silane occurs.

Figure 10:
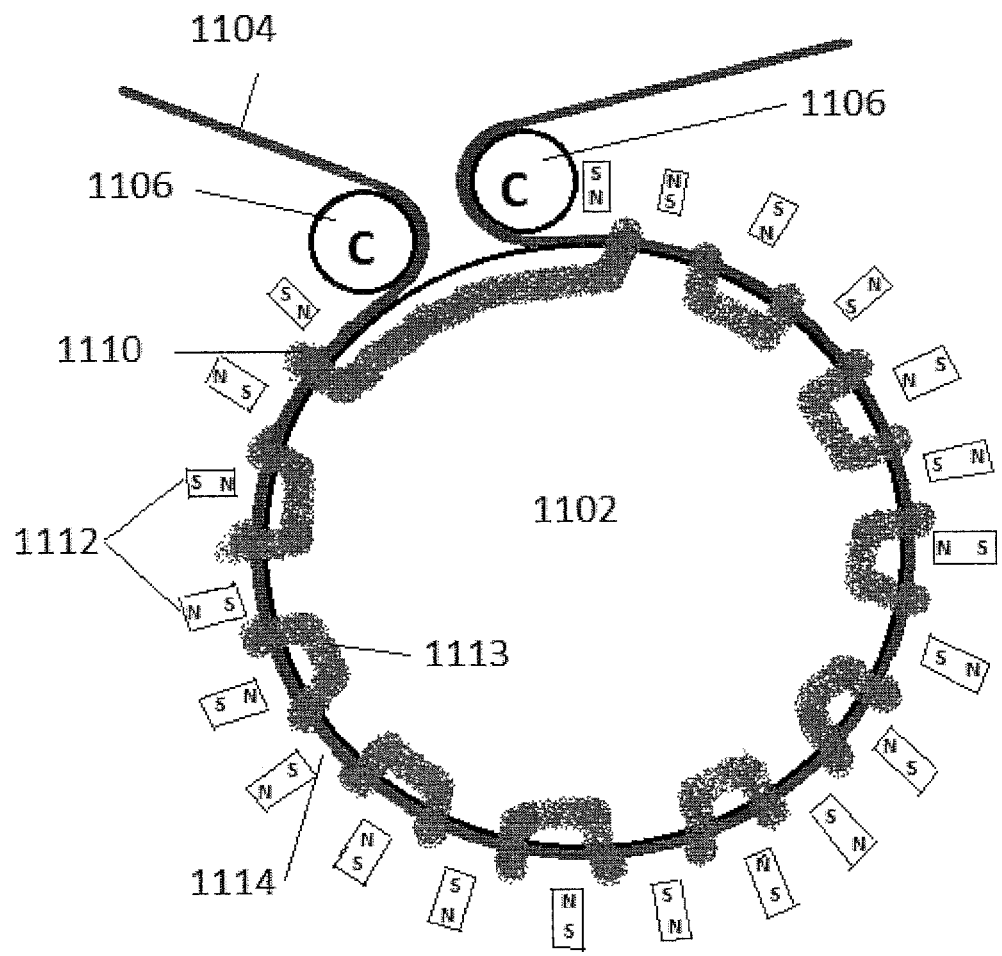
FIG. 10 is a schematic diagram of an apparatus for curing or processing a substrate according to an embodiment of the invention.
Figure 11:
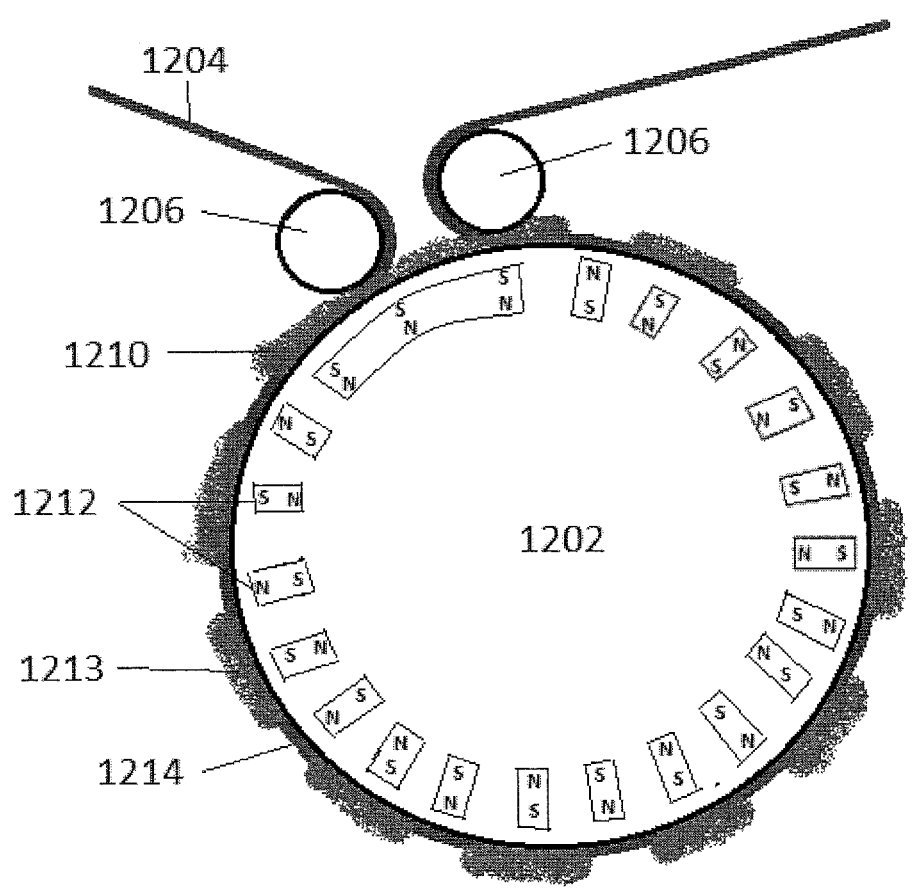
FIG. 11 is a schematic diagram of an apparatus for curing or processing a substrate according to an embodiment of the invention.

FIGS. 10 and 11 show embodiments which include magnet arrays arranged to define a serpentine racetrack. Preferably the magnet array is housed within the deposition drum as displayed in FIG. 11, rather than outside as shown in FIG. 10, as this allows more space for the Silane deposition equipment around the drum and enables the shape and position of the race track portions to be more easily controlled.

In FIG. 10 the end turning portions 1113 of the racetrack 1110 are shown on the ends of the drum 1102. In FIG. 11, the end turning portions 1213 of the racetrack 1210 are shown on the circumferential surface of the drum 1102. For clarity, only the elongate magnets running longitudinally down the length of the drum 1102, 1202 are shown. In FIG.

Figure 13:
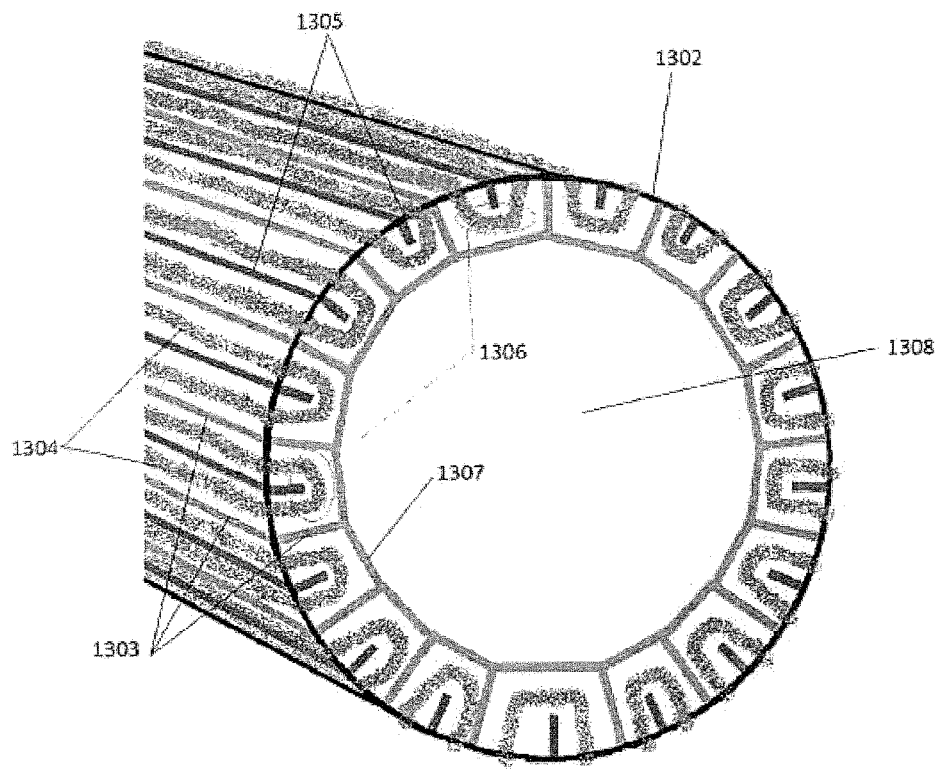
FIG. 13 is a schematic diagram of a drum containing an internal magnet array for generating a snaking racetrack where the end turning portions of the racetrack are on the ends of the drum.
Figure 14:
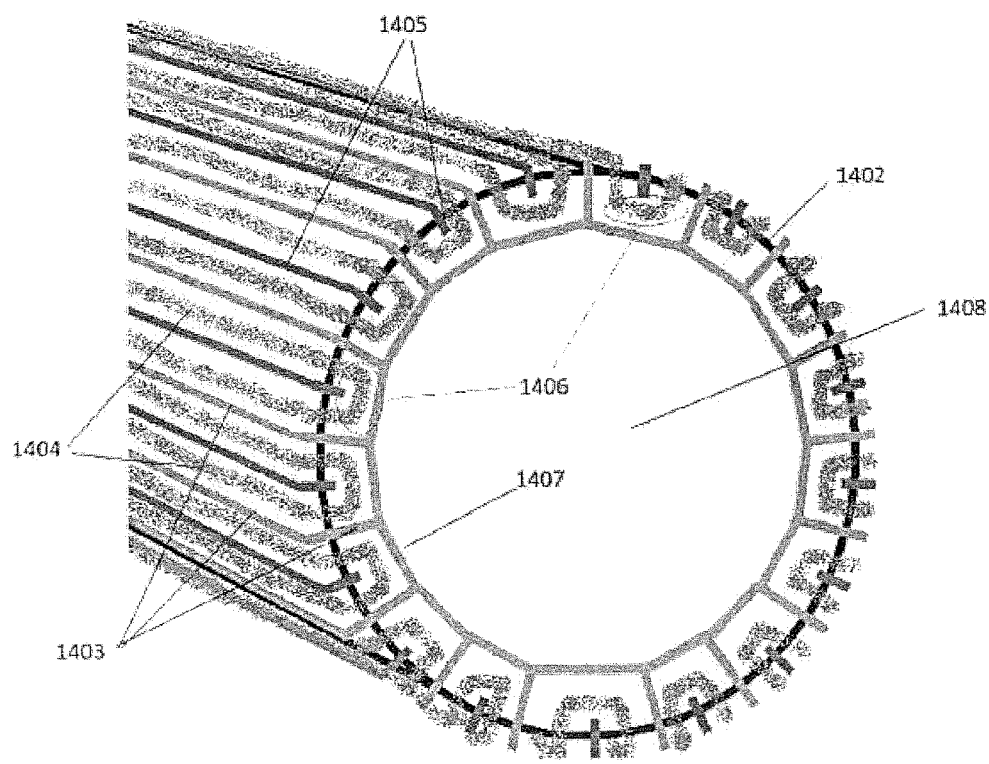
FIG. 14 is a schematic diagram of a drum with an external magnet array for generating a snaking racetrack where the end turning portions of the racetrack are on the ends of the drum.

11, an alteration to the magnet array is required to move the end turning portion 1113 onto the perpendicular end of the drum 1102. This can be achieved with either the magnets inside or outside the drum by turning the elongate magnets 1102, 1202 at the ends and extending them towards the radial centre of the drum 1102. Typically the magnets would be turned by 90° for a flat ended roller however the invention is not limited to precisely 90° and other angles are possible. For example, if a convex or cone ended drum is utilised the angle at which the magnets were turned would best achieve the desired result if the angle at which the magnets turned closely matched the angle on the drum. The alternate staggered offsetting of the magnets would be retained and an optional ring of magnets, of the same orientation as those of the elongate magnets offset towards that end of the roller, can then added on the roller end either internally to the roller or external to it. FIGS. 13 and 14 show this arrangement on one end of a roller for either an internal magnet array (FIG. 13) or external magnet array (FIG. 14)

Figure 12:
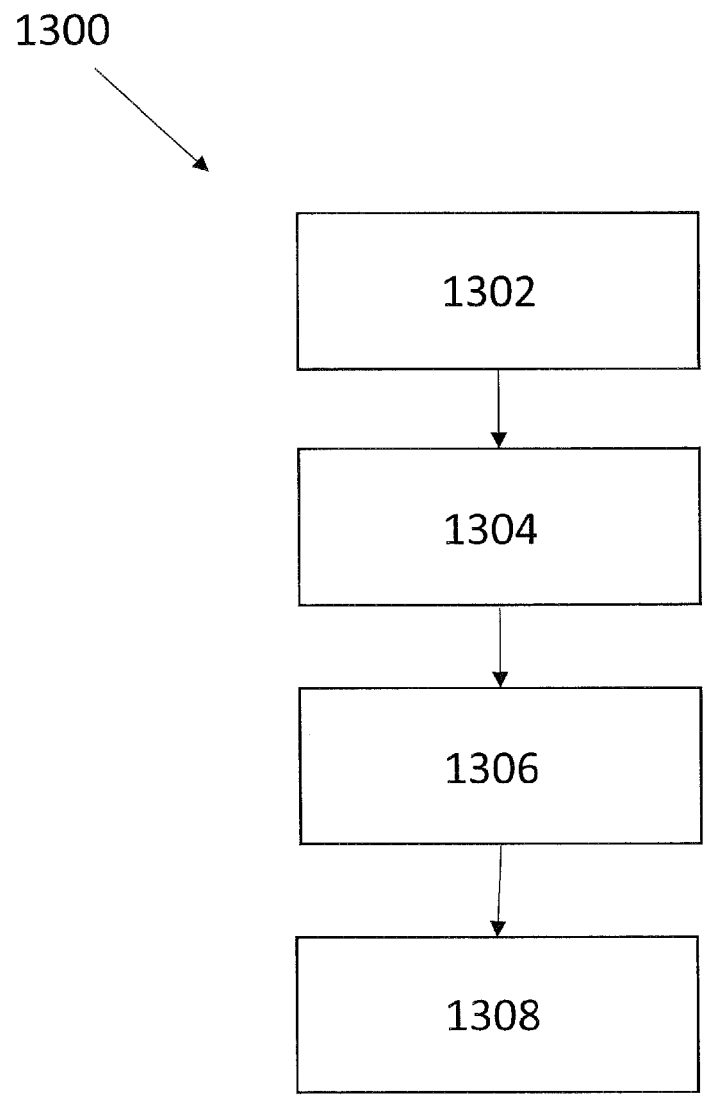
FIG. 12 is a schematic diagram of a method of curing or processing a substrate.

FIG. 12 shows a method for curing or processing a substrate using the apparatus shown in FIG. 10, the method including the steps of, firstly, at step 1302, transporting the substrate underneath a first precursor inlet 1008, which applies Silane precursor to the surface of the moving substrate 1004. Secondly, at step 1304 a generated plasma 1010 is directed onto the surface of the substrate 1004 such that the precursor on the surface of the substrate 1004 is reacted to form a first barrier layer at step 1304. The substrate 1004 is then transported under a second precursor inlet which applies a second dose of Silane precursor at step 1306. At step 1308 the substrate is transported into a second plasma racetrack zone such that the second layer of precursor is reacted to form a second barrier layer on top of the first barrier layer. Optionally, the substrate may pass through additional curing stations arranged to repeat the steps of dosing with precursor and plasma curing so that eventually a barrier layer of required thickness (typically between 2 and 100 nm and more preferably between 5 and 50 nm) is built up.

Although the method and apparatus of FIGS. 9 to 12 use a Silane precursor, the skilled person will appreciate that in other embodiments of the method and apparatus, other precursors could be used.

FIGS. 13 and 14 show embodiments of the invention whereby the end turning portions 1306, 1406 of the racetrack are wrapped onto the end surfaces 1308, 1408 of a drum 1302, 1402.

FIG. 13 depicts an embodiment where the magnet array is situated inside the drum 1302 and the end turning portions 1306 of the racetrack are positioned on the ends surface 1308 of the drum 1302. In this embodiment the two oppositely arranged elongate magnets 1303 and 1305 both continue across the complete width of the drum 1302. Both oppositely arranged elongate magnets 1303 and 1305 are then turned and extended towards the radial centre of the drum 1302. On the end depicted, the elongate magnets 1303 extend further towards the radial centre of the drum 1302 than elongate magnets 1305. An optional ring of magnets 1307 with the same orientation as elongate magnets 1303 can be provided to link up elongate magnets 1303. On the opposite end (not shown) the elongate magnets 1305 extend further towards the radial centre of the drum 1302 than elongate magnets 1303. An optional ring of magnets with the same orientation as elongate magnets 1305 can link up elongate magnets 1305. The whole magnet array is fixed inside the drum 1302 such that such that as the drum 1302 turns the magnet array does not turn with the drum 1302 but allows the circumferential surface of the drum 1302 and any transported substrate to turn over them. In this embodiment the straight parallel portions 1304 of the plasma racetrack run across the width of the drum 1302 along the circumferential surface. The curved end turning portions 1306 of the plasma racetrack are generated on the end surface 1308 of the drum 1302.

FIG. 14 depicts an embodiment where the magnet array is situated as a cage outside the drum 1402. The cage can be enclosed with non-magnetic materials and carry additional ancillary systems such as water cooling that are not shown. The end turning portions 1406 of the racetrack are generated on the ends of surface 1408 of the drum 1402. In this embodiment the two oppositely arranged elongate magnets 1403 and 1405 both continue beyond the complete width of the drum 1402. Both oppositely arranged elongate magnets 1403 and 1405 are then turned and extended towards the radial centre of the drum 1402. On the end depicted, the elongate magnets 1403 extend further towards the radial centre of the drum 1402 than elongate magnets 1405. An optional ring of magnets 1407 with the same orientation as elongate magnets 1403 can link up elongate magnets 1403. On the opposite end (not shown) the elongate magnets 1405 extend further towards the radial centre of the drum 1402 than elongate magnets 1403. An optional ring of magnets with the same orientation as elongate magnets 1405 can link up elongate magnets 1405. The whole magnet array is fixed independently of the drum 1402 such that such that as the drum 1402 turns the magnet array does not turn with the drum 1402 but allows the circumferential surface of the drum 1402 and any transported substrate to turn below it. In this embodiment the straight parallel portions 1404 of the plasma racetrack run across the width of the drum 1402 along the circumferential surface. The curved end turning portions 1406 of the plasma racetrack are generated on the end surface 1408 of the drum 1402.

The advantage of having the curved end turning portions 1306, 1406 on the drum end surfaces 1308, 1408 is that it allows the maximum surface of the drum to be utilised for coating or treating a substrate. Additionally, during operation, a degree of sputtering and erosion caused by the plasma racetrack can occur where there is no substrate on the surface of the drum. By moving the curved end turning portions 1306, 1406 onto the end of the drum 1308, 1408 this can be mitigated by allowing optional sacrificial surfaces (not shown) to be added to the end surfaces 1308, 1408 of the drum 1302, 1402. These can then be replaced periodically preventing damage to the drum 1302, 1402 and increasing service life.

Although the invention has been described above with reference to one or more preferred embodiments, it will be appreciated that various changes or modifications can be made without departing from the scope of the invention as defined in the appended claims. The word "comprising" can mean "including" or "consisting of" and therefore does not exclude the presence of elements or steps other than those listed in any claim or the specification as a whole. The mere fact that certain measures are recited in mutually different dependent claims does not indicate that a combination of these measures cannot be used to advantage.

What is claimed is:

1. An apparatus for processing, curing or coating a substrate, the apparatus comprising:
   a plasma generator arranged to generate plasma; and
   a magnet array arranged to spatially define the plasma to form a closed loop plasma racetrack, the magnet array comprising a plurality of elongate magnets arranged in a parallel relationship with alternating polarities, with each elongate magnet having a first end defining a passage region where flux extends around the first end of the magnet and a second end defining a blocking region which inhibits flux extending around the second end of the magnet so as to define a serpentine closed loop plasma racetrack, wherein the substrate is flexible and the apparatus further comprises a cylindrical drum having an inner circumferential surface and an outer circumferential surface and the drum is arranged and configured to rotate to transport the flexible substrate on the outer circumferential surface, and wherein the magnet array is arranged and configured such that the serpentine, closed loop plasma racetrack extends 360 degrees around the drum with the drum disposed between the magnet array and the serpentine, closed loop plasma racetrack.

2. An apparatus according to claim 1 wherein the magnet array comprises:
a first elongate magnet having a first polarity;
a second elongate magnet, positioned adjacent and substantially parallel to the first elongate magnet, having a second polarity opposite to the first polarity, such that the first and second elongate magnets define a first straight magnetic flux portion between them;
a third elongate magnet having a first end and a second end, the third magnet being positioned adjacent and substantially parallel to the second elongate magnet, having the first polarity, such that the second and third elongate magnets define a second straight magnetic flux portion between them, the second straight magnetic flux portion being connected to the first straight magnetic flux portion by a first curved magnetic flux portion which extends around the first end of the second elongate magnet; and
a fourth elongate magnet positioned adjacent and substantially parallel to the third elongate magnet, the fourth elongate magnet having a first end and a second end, the first end being adjacent to the second end of the third elongate magnet, the fourth elongate magnet having the second polarity, such that the third and fourth elongate magnets define a third straight magnetic flux portion between them, the third straight magnetic flux portion being connected to the second straight magnetic flux portion by a second curved magnetic flux portion which extends around the first end of the third elongate magnet.

3. An apparatus according to claim 1 wherein each of the elongate magnets is formed from a plurality of individual magnets.

4. An apparatus according to claim 2 wherein the center of the first elongate magnet is aligned with the center of the third elongate magnet and the center of the second elongate magnet is aligned with the center of the fourth elongate magnet, and wherein the centers of the first and third elongate magnets are offset with respect to the centers of the second and fourth elongate magnets.

5. An apparatus according to claim 2 wherein the magnet array further comprises one or more turning magnets located at one or both ends of each elongate magnet, wherein the turning magnets have the same polarity but a different orientation from the orientation of the elongate magnets.

6. An apparatus according to claim 5 wherein first and third turning magnets are located at a first end of the first and third elongate magnets respectively and second and fourth turning magnets are located at a second end of the second and fourth elongate magnets, wherein the second end is opposite to the first end, and wherein the turning magnets have an orientation that is perpendicular to the orientation of the elongate magnets.

7. An apparatus according to claim 6 wherein the center of each turning magnet is aligned with the longitudinal axis of each corresponding elongate magnet.

8. An apparatus according to claim 6 wherein one end of each of the turning magnets is aligned with the longitudinal axis of each corresponding elongate magnet.

9. An apparatus according to claim 6 wherein the first turning magnet is in contact with the third turning magnet and the second turning magnet is in contact with the fourth turning magnet.

10. An apparatus according to claim 5 wherein the elongate magnets and turning magnets of the magnet array are arranged into a staggered or zigzag formation.

11. An apparatus according to claim 5 wherein
a turning magnet is located at one end of each of the elongate magnets, wherein the turning magnets are oriented at 45° to the elongate magnets and are located at alternate ends of each of the elongate magnets.

12. An apparatus according to claim 1, wherein the magnet array is located within the drum and disposed around the inner circumferential surface and arranged and configured such that the serpentine, closed loop plasma racetrack extends 360 degrees around the outer circumferential surface.

13. An apparatus according to claim 1, wherein the magnet array is arranged and configured such that the serpentine, closed loop plasma racetrack comprises a plurality of parallel racetrack portions each extending across the outer circumferential surface of the drum, each pair of adjacent racetrack portions being connected by a single turning region which extends around the circumferential surface of the drum, wherein the parallel offset distance between each racetrack portion of the serpentine, closed loop plasma racetrack is equal.

14. An apparatus according to claim 1, wherein the drum has a first axial end and a second axial end and wherein all elongate magnets of a first polarity have passage regions closer to the first axial end than the second axial end and blocking regions closer to the second axial end than the first axial end and all elongate magnets of a second polarity have passage regions closer to the second axial end than the first axial end and blocking regions closer to the first axial end than the second axial end.

* * * * *